(12) United States Patent
Qi et al.

(10) Patent No.: US 10,250,265 B2
(45) Date of Patent: *Apr. 2, 2019

(54) SINGLE-LOCK DELAY LOCKED LOOP WITH CYCLE COUNTER AND METHOD THEREFOR

(71) Applicant: Everspin Technologies, Inc., Chandler, AZ (US)

(72) Inventors: Jieming Qi, Austin, TX (US); Aaron Willey, South Burlington, VT (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/059,136

(22) Filed: Aug. 9, 2018

(65) Prior Publication Data

US 2018/0351560 A1 Dec. 6, 2018

Related U.S. Application Data

(63) Continuation of application No. 15/583,539, filed on May 1, 2017, now Pat. No. 10,056,909.

(51) Int. Cl.
| | |
|---|---|
| *G11C 11/00* | (2006.01) |
| *H03L 7/081* | (2006.01) |
| *G11C 11/16* | (2006.01) |
| *H03L 7/14* | (2006.01) |

(52) U.S. Cl.
CPC ........ *H03L 7/0818* (2013.01); *G11C 11/1693* (2013.01); *H03L 7/14* (2013.01)

(58) Field of Classification Search
CPC ...... H03L 7/0818; H03L 7/14; G11C 11/1693
See application file for complete search history.

(56) References Cited

U.S. PATENT DOCUMENTS

| | | | |
|---|---|---|---|
| 7,421,606 B2 | 9/2008 | Kim | |
| 7,602,223 B2* | 10/2009 | Baek | ..................... H03L 7/0812 327/155 |
| 8,648,635 B2 | 2/2014 | Willey et al. | |
| 8,729,941 B2 | 5/2014 | Willey | |
| 9,536,591 B1* | 1/2017 | Kwak | ................. G11C 11/4093 |
| 10,056,909 B1 | 8/2018 | Qi et al. | |
| 2004/0008064 A1* | 1/2004 | Kashiwazaki | ............ G06F 1/12 327/158 |
| 2011/0234279 A1 | 9/2011 | Kim et al. | |
| 2011/0234378 A1 | 9/2011 | Radley et al. | |
| 2011/0291720 A1 | 12/2011 | Ku | |

(Continued)

*Primary Examiner* — Toan K Le

(74) *Attorney, Agent, or Firm* — Bookoff McAndrews, PLLC

(57) ABSTRACT

Once a delay locked loop has been locked to a clock signal, an omitted clock cycle is injected into the input of the delay locked loop without stopping the operation of the delay locked loop. The omitted cycle is later detected at an output of the delay locked loop, and the delay between the input and output is determined based on the time the omitted cycle requires to propagate through the delay locked loop. Once determined, the number of cycles of delay for the delay locked loop can be used in conjunction with an internal clock signal to launch data and/or data strobes from memory devices and memory controllers such that the proper phase alignment and clock cycle alignment is achieved.

20 Claims, 4 Drawing Sheets

(56) References Cited

U.S. PATENT DOCUMENTS

| | | | |
|---|---|---|---|
| 2013/0021073 A1* | 1/2013 | Kim | H03L 7/0814 327/158 |
| 2015/0235691 A1* | 8/2015 | Kwak | G11C 11/4076 365/194 |
| 2015/0263740 A1 | 9/2015 | Jung et al. | |

* cited by examiner

SINGLE-LOCK DELAY LOCKED LOOP WITH CYCLE COUNTER AND METHOD THEREFOR

CROSS REFERENCE TO RELATED APPLICATIONS

This application is a continuation of U.S. application Ser. No. 15/583,539, filed May 1, 2017, now U.S. Pat. No. 10,056,909, the entireties of which are herein incorporated by reference.

TECHNICAL FIELD

The disclosure herein relates generally to delay locked loops (DLLs) and more particularly to circuits and methods for determining a number of clock cycles of delay in such delay lock loops and their use in memories.

BACKGROUND

Delay locked loops are well known in the art for monitoring and adjusting delays of timing signals used with circuitry on integrated circuits, where the delays through the circuitry can vary with the changing conditions experienced by the integrated circuits. For example, higher temperatures can increase the delay through circuit components. Similarly, fluctuations in the voltage supply provided to an integrated circuit can cause the delays through the circuit components to fluctuate, where higher voltages may reduce delays and lower voltages may increase delays. Such delay variations can also be affected by processing variations during the manufacture of the integrated circuits.

In order to provide precise timing for signals and account for the variation in delay through the circuit components, delay locked loops typically include replicas or dummy-versions of the circuit components in a feedback path through which a periodic signal such as a clock signal is propagated. Delay lines included in the delay locked loop delay the periodic signal for a variable amount of time in order to achieve a desired phase relationship between a signal used to time operations performed on the integrated circuit and the periodic signal. As frequencies of clock signals used on and with integrated circuits increase, thereby resulting in shorter periods for those clock signals, the total delay through a delay locked loop can be longer than the time for a single period of the clock signal provided to the delay locked loop. In other words, a first positive edge of the clock provided to the loop may not have exited the delay locked loop before the next positive edge has entered the loop. In such systems, the number of clock cycles of delay through the delay locked loop can be important in terms of determining in which clock cycle certain events occur. Thus, while the delay locked loop may provide desirable phase alignment for a timing event with respect to a clock signal, it may also be necessary to ensure the event occurs in the correct clock cycle.

Therefore, it is desirable to provide techniques for determining a number of clock cycles of delay through a delay locked loop with minimal interference with the operation of the delay locked loop.

DETAILED DESCRIPTION

Figure 1:
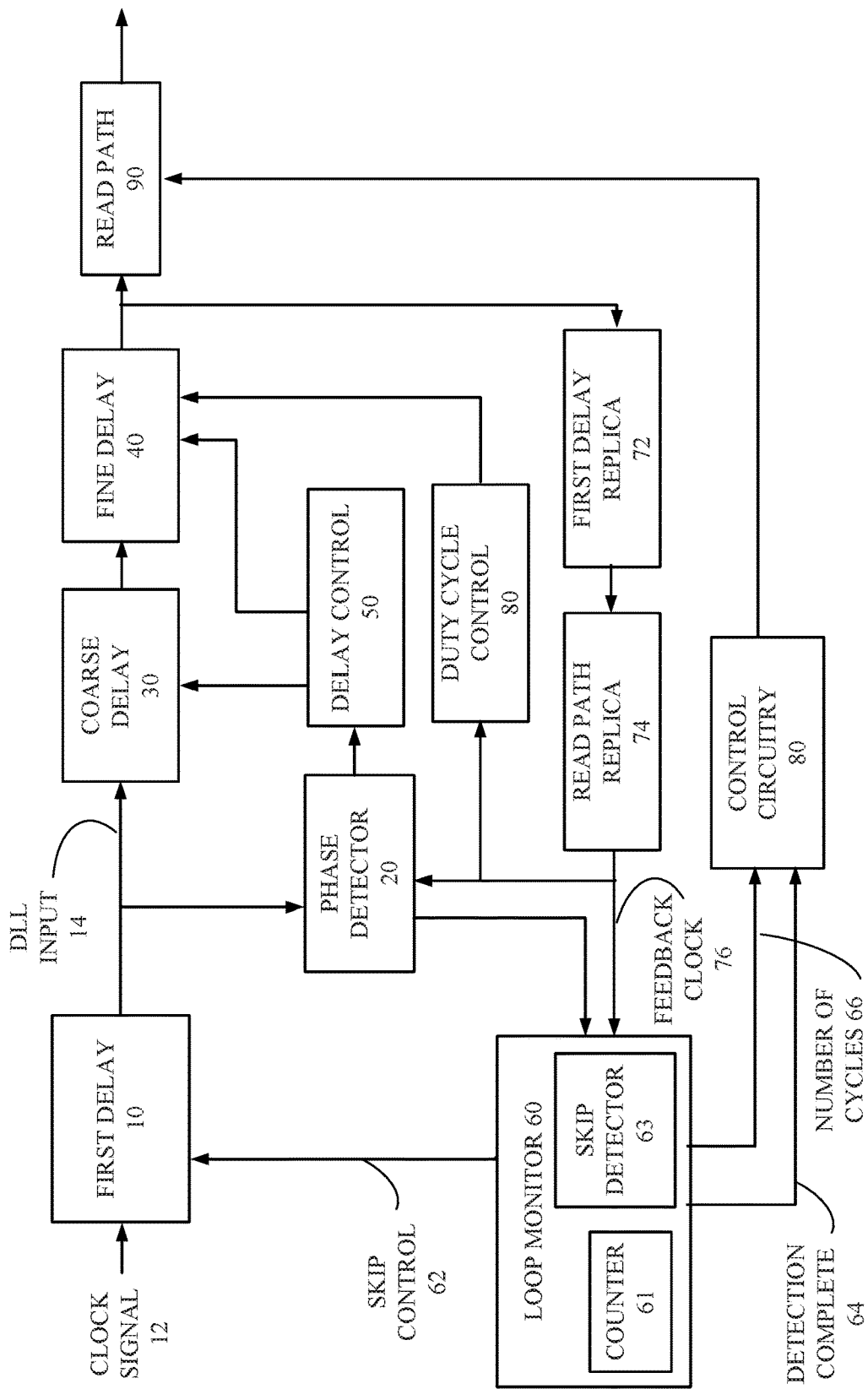
FIG. 1 is a block diagram corresponding to a delay locked loop and associated circuitry in accordance with an exemplary embodiment.

The following detailed description is merely illustrative in nature and is not intended to limit the embodiments of the subject matter or the application and uses of such embodiments. Any implementation described herein as exemplary is not necessarily to be construed as preferred or advantageous over other implementations.

For simplicity and clarity of illustration, the figures depict the general structure and/or manner of construction of the various embodiments. Descriptions and details of well-known features and techniques may be omitted to avoid unnecessarily obscuring other features. Elements in the figures are not necessarily drawn to scale: the dimensions of some features may be exaggerated relative to other elements to assist improve understanding of the example embodiments.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, memory operation protocols, construction of delay lines used in delay locked loops, and basic principles of memory devices. During the course of this description, like numbers may be used to identify like elements according to the different figures that illustrate the various exemplary embodiments.

For the sake of brevity, conventional techniques related to clock signals, reading and writing memory, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

Nonvolatile memory devices are often used in various applications in order to store data that remains valid after power is no longer applied. Examples of such nonvolatile memory devices include resistive memory devices such as magnetic random access memories (MRAMs) in which the resistance experienced by current flowing through the memory cell varies based on the orientation of magnetic vectors within the memory cell and where such resistance variations are used to store data. Spin torque memory devices send a current through the magnetoresistive stack in order to store information in a memory cell. Depending on the direction of the current, and assuming it has adequate magnitude, the free portion of the memory cell will be forced into a corresponding magnetic state indicative of the information to be stored in the cell.

MRAMs that support the double data rate synchronous dynamic random access memory (DDR SDRAM) operation protocols can be used to provide non-volatile memory storage in systems without requiring modifications to, or at least without requiring extensive modifications to, existing memory controllers. The DDR SDRAM protocol is a standardized protocol that utilizes both the rising edge and the falling edge of each clock cycle to transfer data in a memory system. As the frequencies of the clock signals used with such data transfer protocols continue to increase, the amount of time included in each cycle of the clock signal is reduced. For example, DDR SDRAM devices supporting a 200 MHz clock rate are available, where each clock cycle only includes 5 ns. When both edges are used to transfer data, data is delivered every 2.5 ns.

In order to help ensure accurate data transmission in such high-speed systems, a data strobe can be sent with the data where the transition (edge) of the data strobe at the receiving end of the interface can be used to help capture the data. Because the routing of the signal lines used to carry the data signals and the routing of the signal line used to carry the data strobe are the same or at least very similar, the time of flight associated with those signals is generally the same. In other words, the transition on the strobe signal will take the same amount of time to travel from the output of the sending integrated circuit to the input of the receiving integrated circuit as the data signals.

Data transfer in such high speed memories is further facilitated by providing a desired level of alignment or synchronization between transitions on the data strobe signal and the clock signal used to synchronize the memory system. For example, in some embodiments it is desirable for the data strobe signal to transition in alignment with either a rising or falling edge of the clock signal used to synchronize the memory system.

Because the data strobe signal, as well as the data signals themselves, are generated on an integrated circuit such as a memory or a memory controller, there is internal delay that must be accounted for in order to achieve the desired alignment between the signals external to those integrated circuits. For example, an internal signal that causes the data or data strobe to be launched is typically asserted well before the actual transition of the external clock edge with respect to which the data or data strobe is to be synchronized or aligned. Launching the data or data strobe ahead of the clock transition allows the data or data strobe to move through the internal circuitry of the integrated circuit, where after propagating through the internal circuitry and the delay of that internal circuitry, the data or data strobe is driven at the outputs of the integrated circuit in proper synchronization with the external clock signal.

As discussed above, the delay through the internal components of integrated circuits can vary based on changes in temperature, voltage, processing, etc. As is known in the art, those variations in delay of the internal components can be accounted for and adjusted for by using a delay locked loop to replicate the components or create dummy versions of the components and monitor the changes in the delay through those replicated or dummy components. Thus, the delay locked loop can provide the needed adjustment to the time at which a signal launch occurs within the integrated circuit such that the phase of the signal output is properly aligned with the clock signal at the edge of the integrated circuit.

In many protocols, including the DDR SDRAM protocol, the delay locked loop is given a certain number of clock cycles to achieve a "locked" state with respect to the clock signal. The locked state is achieved when a phase detector in the delay locked loop determines that the desired phase relationship between the clock signal received by the delay locked loop and a feedback block signal has been achieved. As discussed below, the phase detector provides input to adjust delays in the delay locked loop until the delay locked loop is locked.

In many systems, including memory systems that utilize the DDR SDRAM protocol, the specific clock cycle within which certain events are to occur is important in order to allow the accurate transmission of data and control signals. In the DDR SDRAM protocol, the latency between the receipt of a request perform certain operations and the transfer of data associated with those operations is controlled and can be programmed using mode registers on the memory. While different protocols implement the delay between receipt of a request and the transmission of the associated data in different ways, a simple version of the concept is to store a value in a register, where the value is representative of a number of clock cycles between receipt of a request to transfer data and the transference of that data. For example, the register can store a read latency value, where a first value stored in the register indicates that data should be output seven clock cycles after the request for the data has been received, whereas in another instance a second value in the register indicates that the data should be output eight clock cycles after the request.

As such, the internal signal that causes the data to be launched by the memory needs to occur not only in the proper phase alignment with the external clock signal, but also in a manner that takes into account how many clock cycles of delay may exist between the circuit receiving the launch signal and the actual output at the edge of the memory. For example, if the multiplexers and output buffers in the output path of the data downstream from the launching circuitry have a total delay on the order of three clock cycles, then the launch indication needs to be provided at least three clock cycles ahead of time in order for the data to traverse that output circuitry and arrive at the outputs of the memory during the proper clock cycle.

As such, it is important to know the total number of clock cycles of delay that exist in a delay locked loop in order to know the proper clock cycle within which to cause data or a strobe signal to be launched. As discussed herein, such a determination is best made while the delay locked loop is in the locked state and the delay lines associated with the delay locked loop are being exercised under the normal loading conditions present during regular operation of the delay locked loop. When the input signal to the delay locked loop is periodic, all of the cycles should be virtually identical. As such, it can be difficult to measure the delay through the delay line, as the output of the delay line in the delay locked loop is also a periodic signal.

As described herein, injecting a skipped cycle into the periodic signal being provided to the delay locked loop can be used to provide a distinguishing signal within the normally periodic signal, where the skipped cycle can be detected at the output of the delay locked loop in order to determine how many clock cycles the skipped cycle required to traverse the delay locked loop. Because the skipped cycle is only a single cycle within the periodic signal, it has minimal impact on the loading characteristics associated with the delay lines included in the delay locked loop. In other words, rather than stopping the delay locked loop and sending a discrete signal through the delay locked loop circuitry that can be detected at the output in order to measure the delay through the delay locked loop, the delay locked loop maintains a locked state during the period of time associated with the skipped cycle moving through the delay locked loop. As such, the loading characteristics within the delay locked loop are not dramatically changed as is the case when the delay locked loop is stopped.

Moreover, because the delay locked loop has already achieved the locked state when the skipped cycle is injected, the time associated with initially locking the delay locked loop and then detecting the total number of clock cycles of delay through the delay locked loop is minimized. In protocols that provide for a limited time to lock the delay locked loop, this is advantageous as the delay locked loop only needs to be locked once. In other systems in which the number of cycles is measured after the delay locked loop is first locked and then stopped to allow for the measurement, the delay locked loop needs to be re-locked after determination of the total number of cycles through the delay locked loop. Having to lock the delay locked loop multiple times can result in the memory system exceeding the specified time available for delay locked loop start up.

FIG. 1 illustrates a block diagram of a delay locked loop and associated circuitry where a skip cycle can be used to determine the amount of delay through the delay locked loop. A clock signal 12 is received by the circuitry of FIG. 1, where in some embodiments the clock signal 12 corresponds to an external clock signal to which data and data strobe alignment is desired. The clock signal 12 is provided to first delay block 10, where in some embodiments, the first delay block 10 includes input buffers or other clock buffering circuits that help distribute the clock signal 12 throughout the integrated circuit on which the circuitry of FIG. 1 is included. As discussed herein, the first delay block 10 also includes circuitry that can be used to insert a skip cycle within the clock signal 12 based on a skip control signal 62 received by the first delay block 10.

As one of ordinary skill in the art appreciates, many circuits can be used to insert a skip cycle into the clock signal 12. In one embodiment, the first delay block 10 simply gates off the clock signal 12 at its output, thereby holding the DLL input 14 low or high and eliminating the transitions associated with the skip cycle. For example, an AND gate can be used where one input is the clock signal 12 and the other input is skip control signal 62. When the skip control signal 62 is asserted low, the output of the AND gate will be held low and the high portion of a cycle of the clock signal 12 is gated off. The first delay block 10 can be a distributed block, where different portions of the first delay block can exist on different portions of the integrated circuit. For example, an initial clock buffer associated with receiving the clock signal 12 and providing it to numerous different internal locations on the integrated circuit may be physically distant from the circuitry used to inject the skip cycle.

The output of the first delay block 10, which is labeled DLL input 14, is provided to a coarse delay block 30. In some embodiments, including those illustrated in FIG. 1, the total adjustable delay through the delay locked loop is separated into a coarse delay and a fine delay, where a coarse delay block allows for larger adjustments to the total delay than the fine delay block. Each of the coarse and fine delay blocks typically includes a delay line. As known by one of skill in the art, the delay lines used in delay locked loops are often series of inverters or buffers that propagate the received signal through the series of inverters or buffers while the individual delay through each of the inverters or buffers can be controlled in order to vary the overall delay through each of the delay lines. The delay through each inverter or buffer can be controlled by a regulator, where the regulator may vary the supply voltages applied to the inverter or buffer such that the inverter or buffer switches slightly faster or slightly slower because of the change in supply voltage.

The coarse delay block 30 performs coarse delay adjustments on the DLL input signal 14 based one or more signals received from the delay control block 50. The delay control block 50 can cause the delay through the coarse delay block 30 to be increased or decreased, where the increments of delay change in the coarse delay block 30 are typically larger than those of the fine delay block 40. Similarly, the fine delay block 40, which receives the output of the coarse delay blocks 30, can be controlled by the delay control block 50 in order to further refine the total delay experienced by the DLL input 14 as it goes through the total delay line that includes coarse delay block 30 and fine delay block 40. Fine delay block 40 can also receive a signal from duty cycle control block 80 in order to adjust the duty cycle of the signal as it propagates through the delay line. Such duty cycle adjustment can be used in order to ensure a particular duty cycle (e.g. amount of time the periodic signal is high versus the amount of time the periodic signal is low in each cycle) is maintained for the periodic signal.

As illustrated in FIG. 1, the output of the fine delay block 40 is provided to a read path block 90 as well as a first delay replica 72. The read path block 90 corresponds to the circuitry used to launch the output signal from the memory, memory controller, or other device on which the delay locked loop circuitry is included. For example, the read path block 90 in a memory may correspond to the circuitry used to launch output data from the memory, where the read path can include multiplexers used to select the data from a larger set of data and buffers used to amplify the signals corresponding to the data such that sufficient drive strength is achieved at the output of the memory.

The first delay replica 72 is circuitry intended to replicate the delay experienced by the clock signal 12 as it moves through the first delay block 10. In some embodiments, the first delay replica 72 includes the same circuitry that is included in first delay block 10, whereas in other embodiments, the delay for the components in first delay block 10 is emulated in some manner within the first delay replica 72 where variations in the delay through the components in first delay block 10 are mirrored in the replica circuitry in first delay replica 72. Thus, the periodic signal entering first delay replica 72 should experience the same delay going through that block as it would going through first delay block 10 under the current conditions. If the delay through first delay block 10 changes based on, for example, a change in voltage or temperature, delay through first delay replica 72 changes in the same manner.

Similarly, the read path replica 74 mimics the delay through read path block 90. In some embodiments the same components can be included in read path replica 74 as are in read path block 90. In other embodiments, circuitry that mimics the delay through read path block 90 is included in read path replica 74. Thus, under the same conditions, the delay experienced by a signal moving through read path replica 74 should match the delay experienced by that signal moving through read path block 90. Notably, the ordering of the first delay replica 72 and read path replica 74 can be reversed with respect to the propagation of the signal going through the delay locked loop. Similarly, the coarse and fine delay blocks 30 and 40 can be reordered such that the signal moving through the delay locked loop goes through the fine delay block 40 before the coarse delay block 30.

The output of the read path replica 74, which is labeled as the feedback clock 76, is provided to a phase detector 20, where the phase detector 20 also receives the output of the first delay block 10. The phase detector 20 compares the phase of the signals it receives and provides input to the delay control block 50 in order to cause the delay control block 50 to adjust the delay through the coarse delay block 30 and/or the fine delay block 40 to achieve a desired phase relationship between the feedback clock signal 76 and the DLL input signal 14.

Once the phase detector 20 determines that the phase of the feedback clock signal 76 and the DLL input signal 14 are in proper alignment, the delay locked loop is considered to be locked. In some embodiments, the desired alignment for these two signals is such that the rising and falling edges of the two signals occur at the same time with a small margin of phase offset allowed. Once this occurs, the phase detector 20 signals loop monitor 60 that the delay locked loop is locked. The loop monitor 60, which receives the feedback clock signal 76 in addition to the signal indicating a locked condition from the phase detector 20, initiates a calibration mode in response to receipt of the lock signal from the phase detector 20.

During the calibration mode, the loop monitor 60 asserts skip control signal 62 to the first delay block 10 such that the first delay block 10 omits a clock cycle in the DLL input signal 14. In some embodiments, the loop monitor 60 asserts the skip control signal 62 for time period corresponding to one clock cycle of the clock signal 12 such that that skip control signal can be used to gate off or restrict transitions within the DLL input signal 14. Thus, when the skip control signal 62 is de-asserted, the first delay block 10 outputs a delayed version of the input clock signal 12 to the input of the delay locked loop. When the skip control signal 62 is asserted, the first delay block 10 outputs a non-transitioning signal as the DLL input signal 14. The lack of transitions within the DLL input signal 14 corresponds to an omitted clock cycle in the delayed version of the clock signal 12.

When the loop monitor 60 asserts the skip control signal 62, the loop monitor 60 also starts keeping track of the number of clock cycles that transpire after asserting the skip control signal 62. The omitted clock signal injected into the DLL input 14 propagates through the coarse delay block 30, the fine delay block 40, the first delay replica 72, and the read path replica 74 before arriving at the loop monitor 60 as a part of the feedback clock signal 76. When the loop monitor 60 detects the omitted clock cycle in the feedback clock signal 76, it determines the number of clock cycles of the clock signal in the delay of the delay locked loop based on the detection of the omitted clock signal. Thus, if the skip control signal 62 is asserted in clock cycle "1" and the omitted clock signal is detected in the feedback clock 76 in clock cycle "4", the number of cycles of delay in the delay locked loop corresponds to three cycles. In some embodiments, the number of cycles of delay in the delay locked loop determined is an integer number of clock cycles, whereas in other embodiments, fractional portions of clock cycles can also be counted or otherwise detected.

In order to determine the number of clock cycles of delay in the delay locked loop, the loop monitor 60 can include a counter 61, where the counter starts counting when the skip control signal 62 is asserted and stops counting when the loop monitor 60 detects the omitted clock signal in the feedback clock signal 76. Loop monitor 60 can also include a skip detector 63, where the skip detector 63 is able to detect the presence of the omitted clock signal within the feedback clock 76. In some embodiments, the skip detector 63 includes a circuit that compares the current cycle of the feedback clock signal 76 with the previous cycle of the feedback clock signal 76. For periodic signal, the current cycle of feedback clock signal 76 and the previous cycle of the feedback clock signal 76 should be virtually the same. However, when the omitted clock signal, which corresponds to a lack of transitions within the feedback clock signal 76, is compared with the previous cycle of the feedback clock signal 76, the lack of transitions corresponding to the omitted clock signal are readily detected and recognized as the omitted clock signal.

Once the loop monitor 60 has detected the omitted clock signal and determined the number of clock cycles of delay within the delay locked loop, the loop monitor 60 asserts a detection complete signal 64 and outputs at least one signal representative of the number of cycles in the delay of the delay locked loop, which is shown in FIG. 1 as number of cycles signal 66. In one example embodiment, the number of cycles signal 66 is a plurality of bits encoding the number of cycles of delay within the delay locked loop.

Control circuitry 80 which is coupled to the loop monitor 60 and the read path 90, receives the detection complete signal 64 and the number of cycles of delay 66 and adjusts timing within the read path 90 to ensure that signals are output by the delay path 90 in the desired clock cycle based in part on the number of cycles of delay through the delay locked loop. For example, the control circuitry 80 can adjust when the output signal is initiated by the read path 90 in a manner such that the output signals output from a memory are in phase alignment with the external clock signal and are output during a selected cycle of the external clock signal. The selected cycle of the external clock signal can be the particular clock cycle specified through the use of an access time register or a similar latency register or circuit.

Upon start-up, the delay locked loop circuit of FIG. 1 only needs to be locked once, and the lock is maintained while the loop monitor 60 determines the number of clock cycles of delay through the delay locked loop. By only inserting a single omitted clock cycle in the DLL input signal 14 provided to the delay locked loop, the loading on the coarse delay block 30 and find delay block 40 is minimally impacted, thereby giving an accurate determination of the number of clock cycles of delay through the delay locked loop. This is in contrast to prior art systems in which the delay locked loop was stopped and the delay through the loop measured using signals propagated through the loop in a manner that altered the loading, and therefore the delay characteristics, of the components within the loop.

Figure 2:
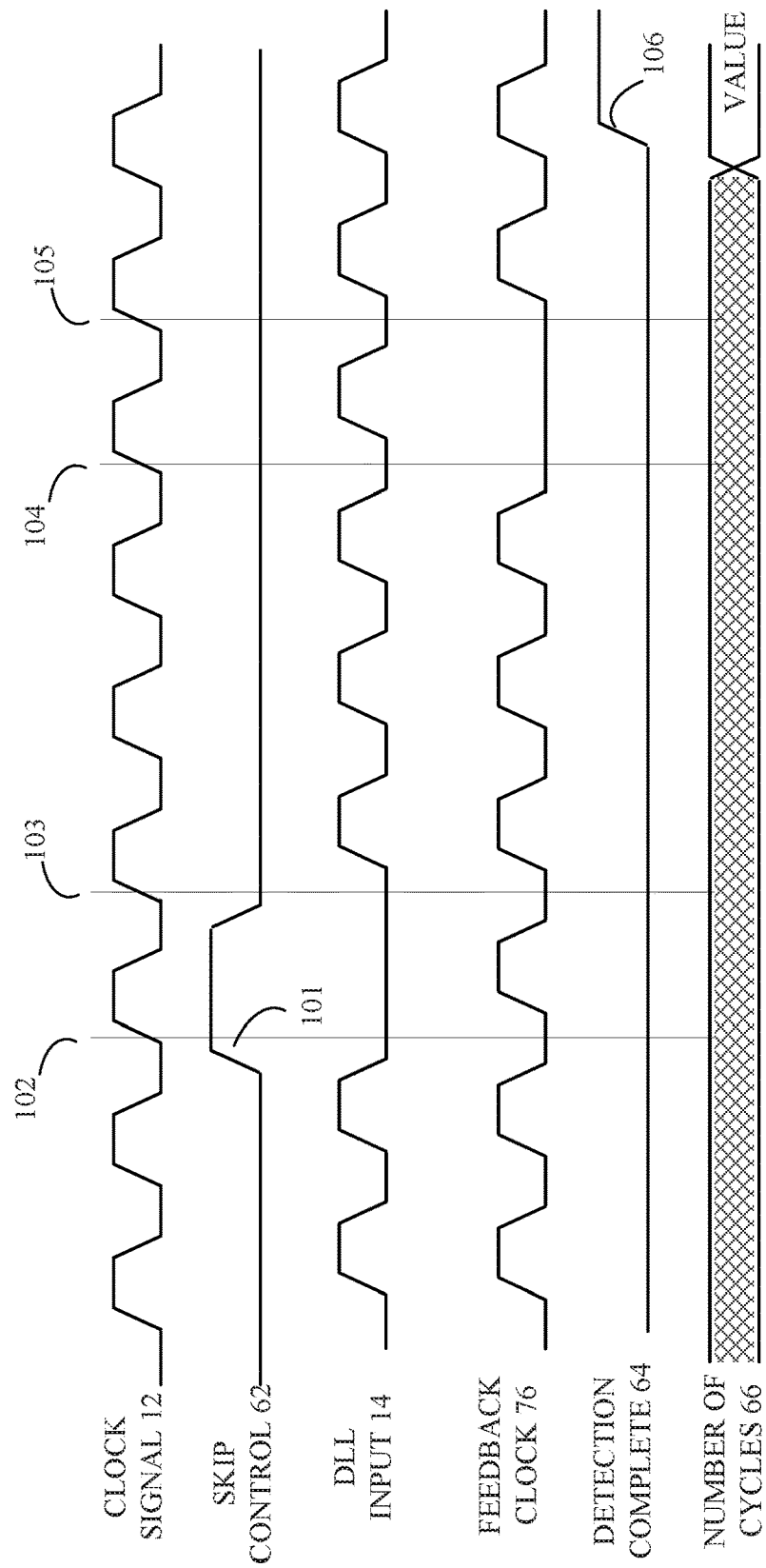
FIG. 2 is a timing diagram associated with the circuitry of FIG. 1 during the determination of a number of clock cycles of delay through the delay locked loop in accordance with an exemplary embodiment.

FIG. 2 provides a timing diagram that illustrates the timing relationships of certain signals associated with the circuitry of FIG. 1. Clock signal 12 is shown at the top of FIG. 2 to be a periodic signal that transitions regularly between the high and low states and has a duty cycle that is approximately 50/50. While the clock signal 12 in FIG. 2 is depicted as a single ended clock signal, and other embodiments, the clock signal may be a differential clock signal. In operation, the clock signal 12, which may correspond to a clock signal to which data and/or data strobe transmission is to be synchronized, is provided to the delay locked loop via the first delay block 10 as DLL input signal 14. Once the delay locked loop locks on to the clock signal 12, the loop monitor 60 asserts skip control signal 62 at edge 101. With the skip control signal 62 asserted, the first delay block 10 omits the omitted clock cycle in the DLL input signal 14. The omitted clock cycle is shown between time points 102 and 103.

The omitted clock signal injected into the DLL input signal 14 propagates through the delay locked loop and reappears in the feedback clock signal 76 between time points 104 and 105. Shortly thereafter, the loop monitor 60 asserts the detection complete signal 64 at 106 and outputs a value (VALUE) on the number of cycles signal(s) 66. In the example shown in FIG. 2, the delay through the delay locked loop experienced by the omitted clock signal is approximately four clock cycles. The single omitted clock cycle has a minimum impact on the number of transitions in the DLL input signal 14.

Notably, in other embodiments, more than one omitted clock cycle can be included in the DLL input signal 14, where multiple omitted clock cycles may improve detectability by the loop monitor. In the embodiment shown in FIG. 2 the omitted clock signal corresponds to the DLL input signal 14 being held low. In other embodiments, inserting an omitted clock cycle corresponds to holding the DLL input signal 14 high. In either case, the omitted clock signal is represented by a lack of transitions, thereby providing easy detectability by the loop monitor. In yet other embodiments, rather than completely omitting one or more clock cycles, one or more clock cycles can be manipulated in order to enable detection of the manipulated clock cycle(s) at the output of the delay locked loop. For example, the amplitude of the high and low transitions within the manipulated clock cycle can be reduced such that the manipulated clock cycle can still be detected by the loop monitor, while such a manipulated clock cycle may have an even lesser impact on the loading associated with the delay locked loop circuitry.

Figure 3:
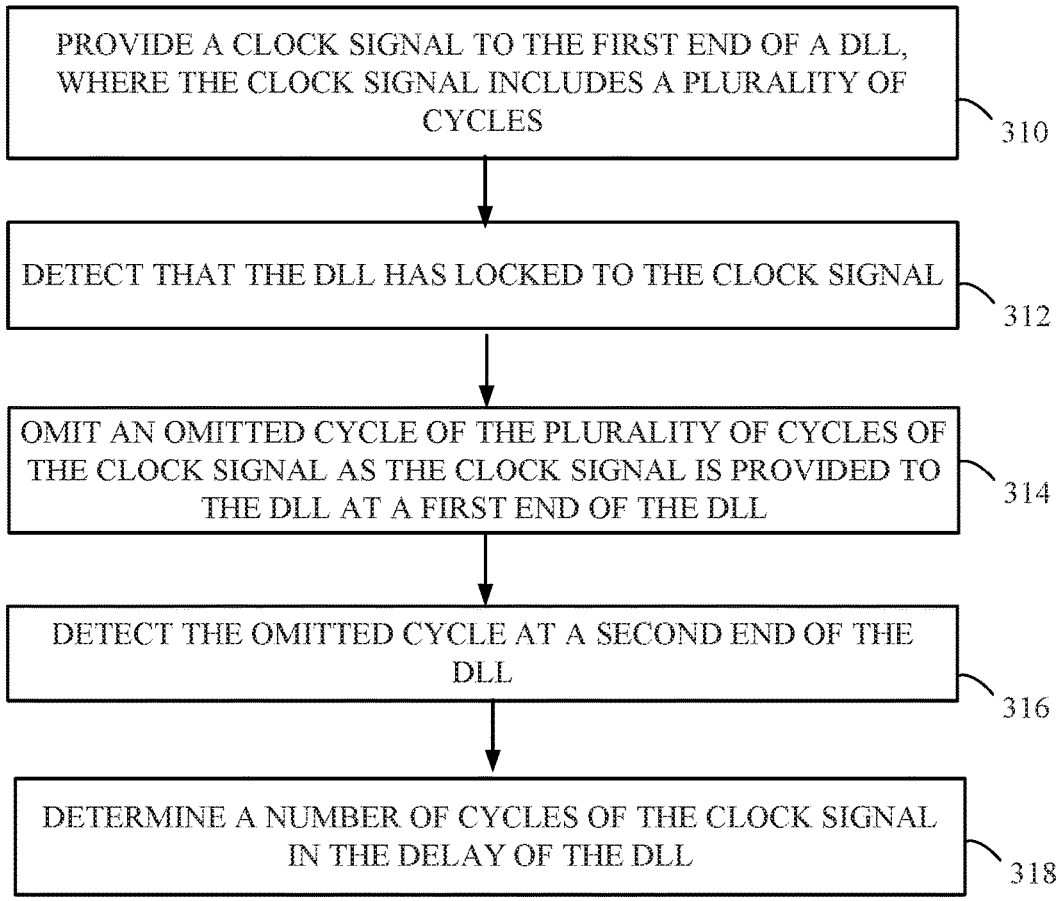
FIG. 3 is a flow chart corresponding to a method for operating a delay locked loop in accordance with an exemplary embodiment.
Figure 4:
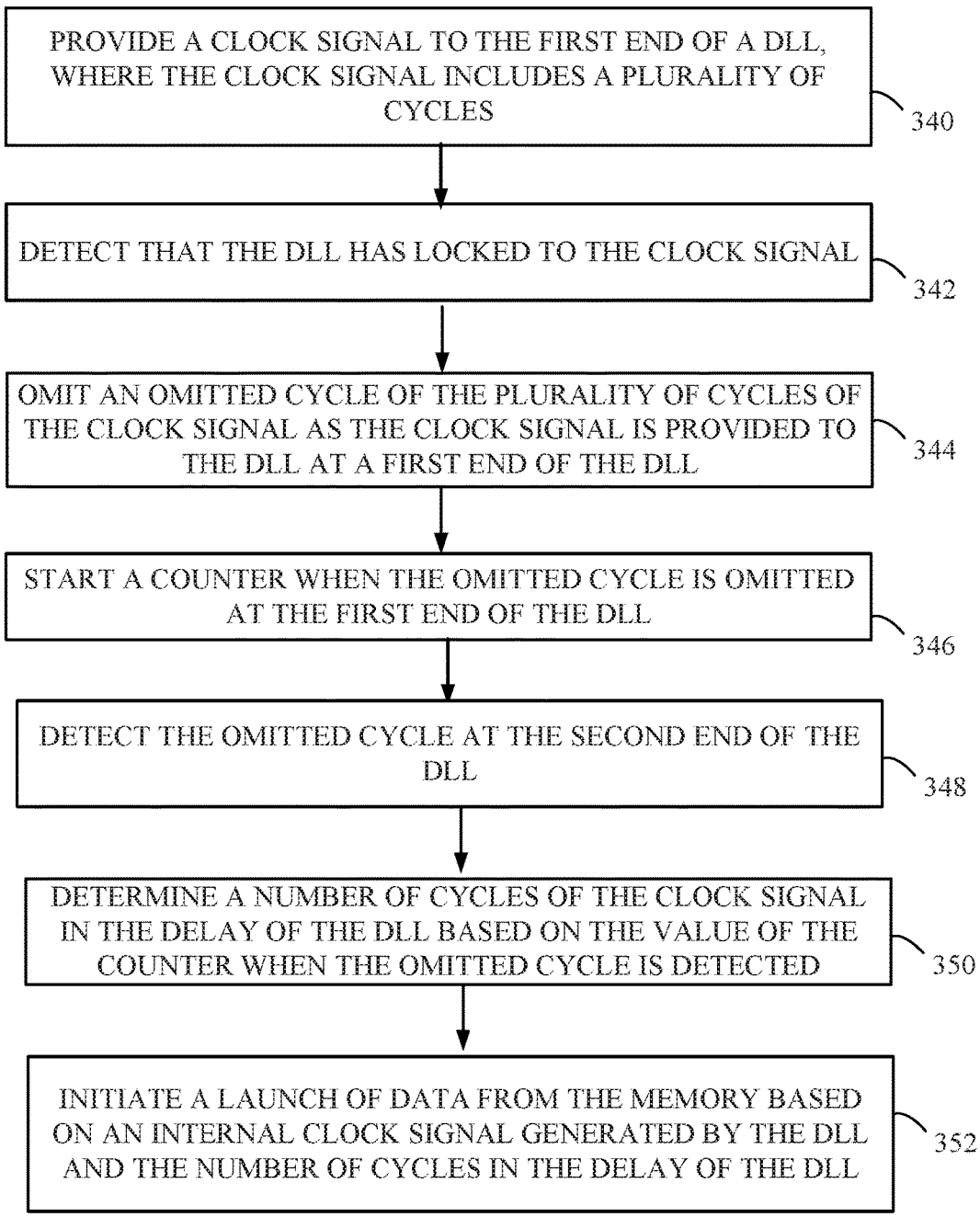
FIG. 4 is a flow chart corresponding to a method for operating a memory that includes a delay locked loop in accordance with an exemplary embodiment.

FIGS. 3 and 4 are flow charts that illustrate exemplary embodiments or aspects of embodiments of a method for operating a delay locked loop and a method for operating a memory that includes a delay locked loop. In one example, the memory is a magnetic memory that supports a DDR SDRAM protocol. The operations included in the flow charts may represent only a portion of the overall process used in operating the delay locked loop and memory. For illustrative purposes, the following description of the methods in FIGS. 3 and 4 may refer to elements mentioned above in connection with FIG. 1. It should be appreciated that methods may include any number of additional or alternative tasks, the tasks shown in FIGS. 3 and 4 need not be performed in the illustrated order, and the methods may be incorporated into a more comprehensive procedure or process having additional functionality not described in detail herein. Moreover, one or more of the tasks shown in FIGS. 3 and 4 could be omitted from an embodiment as long as the intended overall functionality remains intact.

FIG. 3 illustrates a flow chart of a method for operating a delay locked loop, where the delay locked loop has a first end and a second end and where there is a delay experienced by a signal propagating through the delay locked loop. At 310, a clock signal is provided to the first end of the delay locked loop where the clock signal includes a plurality of cycles. As discussed above, the clock signal is a periodic signal and, in some embodiments, corresponds to the clock signal to which data, a data strobe, or some other signals should be synchronized. In some embodiments, the clock signal is a differential clock signal.

At 312, it is detected that the delay locked loop has locked to the clock signal. For example, once the phase detector within the delay locked loop has determined that the adjustments that have been made to the delay elements within the delay locked loop are such that the feedback clock signal in the delay locked loop is properly aligned with the clock signal being provided to the first end of the delay locked loop, the delay locked loop is considered to be locked. At that point, the phase detector can signal that the locked condition has been achieved.

Once it is determined that the delay locked loop has locked to the clock signal, a cycle of the plurality of cycles included in the clock signal is omitted at 314. Thus, the clock signal as provided to the delay locked loop is modified such that an omitted cycle is included within the signal as it is provided to the first end of the delay locked loop. In some embodiments, the cycle is omitted by gating off the clock signal from the first end of the delay locked loop for a time corresponding to the omitted cycle. In other embodiments, a logic gate can be used to combine a skip control signal indicating that a cycle should be omitted with the clock signal to produce the signal provided to the first end of the delay locked loop such that the signal provided includes an omitted cycle. In some embodiments, omitting the omitted cycle includes holding an input at the first end of the delay locked loop low during a cycle of the clock signal corresponding to the omitted cycle. In other embodiments, omitting the omitted cycle includes holding the input at the first end of the delay locked loop high during a cycle of the clock signal corresponding to the omitted cycle.

As discussed above, once provided to the delay locked loop, the omitted cycle propagates through the delay locked loop and eventually appears in the feedback clock signal at the second end of the delay locked loop. At 316, the omitted cycle is detected at the second end of the delay locked loop. In some embodiments, the detection of the omitted cycle is accomplished by comparing the current cycle of the signal at the second end of the delay locked loop with a previous cycle of the signal at the second end of the delay locked loop. In such a comparison, the absence of transitions corresponding to the omitted cycle are detected such that the omitted cycle is recognized.

After the omitted cycle is detected at 316 a number of cycles of the clock signal in the delay through the delay locked loop is determined at 318. The number of clock cycles in the delay corresponds to a number of clock cycles that transpires while the omitted cycle propagates from the first end of the delay locked loop to the second end of the delay locked loop. In one embodiment, determining the number of cycles at 318 includes starting a counter when the omitted cycle is provided to the first end of the delay locked loop and then determining the number of cycles based on the counter when the omitted cycle is detected at the second end of the delay locked loop. As noted above, in some embodiments, the number of cycles in the delay is an integer number of clock cycles. In other embodiments, a fractional number of cycles can be determined.

Notably, while the number of cycles from a first end of the delay locked loop to the second end of the delay locked loop is determined in the embodiment illustrated in FIG. 3, in other embodiments, the delay through a portion of the delay locked loop can be measured rather than the entire delay from end-to-end. For example, referring to FIG. 1, the loop monitor 60 could tap into the signal output from the fine delay block 40 to detect the omitted cycle and measure the delay through only the coarse and fine delay blocks 30 and 40.

Once the number of cycles of delay through the delay locked loop has been determined, an output signal can be generated that indicates that the number of cycles of delay has been determined. While the signal indicating that the number of clock cycles has been determined is output, at least one additional signal representative of the number of cycles in the delay can also be output. Thus, once the number of cycles has been determined, an indication that such a determination has been made can be signaled, and a value or set of signals that represents the number of cycles in the delay can be output for use by other components in the system.

FIG. 4 illustrates a flow chart of a method of operation of a memory that includes a delay locked loop. The delay locked loop includes a first end and a second end and has a delay associated with the time it takes a signal to propagate from the first end of the delay locked loop to the second end. At 340, a clock signal is provided to the first end of the delay locked loop. As discussed above, the clock signal is a periodic signal that includes a plurality of cycles.

At 342 it is detected that the delay locked loop has locked to the clock signal. When the delay locked loop is locked the delay locked loop generates an internal clock signal to provide phase alignment for data output from the memory. Such an internal clock signal can be used by other circuitry downstream from the delay locked loop in order to control the timing of the signals that launch data and or a data strobe from the memory such that timing of those signals is aligned with the settings for the memory.

Once the delay locked loop has locked to the clock signal, a cycle is omitted in the clock signal as that signal is provided to the first end of the delay locked loop at 344. As discussed above, omission of a cycle can be accomplished by holding the input at the first end of the delay locked loop in the high or low state during the cycle to be omitted. In embodiments involving a differential clock signal, the differential input is maintained in a state where no transitions occur during the omitted cycle. In some embodiments, when the omitted cycle is injected into the input clock corresponding to the delay locked loop, a counter is started at 346 in order to eventually provide a count of the number of cycles of the clock signal present in the delay through the delay locked loop.

At 348, the omitted cycle is detected at the second end of the delay locked loop. Based on the detection of the omitted cycle at the second end of the delay locked loop, the number of cycles of the clock signal included in the delay of the delay locked loop is determined at 350. In embodiments in which a counter is used to count the number of cycles as the omitted clock cycle propagates through the delay locked loop, the number of clock cycles is determined based on the value of the counter when the omitted cycle is detected.

At 352, the launch of data and/or a data strobe from the memory is initiated based on an internal clock signal generated by the DLL and the number of cycles in the delay of the DLL as determined at 350. In some embodiments, initiating the launch of data and/or the data strobe includes initiating the launch based on the internal clock signal such that data output from the memory is phase aligned with an external clock signal received by the memory. In some embodiments initiating the launch of data includes initiating the launch such that the data output corresponds to a selected clock cycle of the external clock signal, where the selected clock cycle can be determined based on a value stored in a register on the memory. Such a value stored in a register may be a latency value stored in the register, where the latency value is representative of a number of clock cycles of an external clock signal to transpire between the receipt of a read operation code or command by the memory and the output of data corresponding to the read operation code or command by the memory. For example, while the internal clock signal generated by the delay locked loop may provide the needed phase alignment for the signal used to launch the data, the number of clock cycles of delay through the delay locked loop may be needed to ensure that the data appears at the outputs of the memory during the correct clock cycle.

As the frequency of clock signals provided to memory devices and memory controllers within memory systems continues to increase, maintaining accuracy of a determination as to how many clock cycles of delay are present in a delay lock loop can become more difficult. As such, having less of an impact on the delay lock loop while such a determination is being made becomes increasingly important. By using an omitted clock cycle that propagates through the delay lock loop to determine the number of clock cycles of delay that exist within the components of the delay locked loop, such a determination can be made without stopping the delay locked loop and with minimal influence on the delay through the components included within the delay locked loop. In embodiments such as memory devices or memory controllers that include such a delay locked loop, only needing to lock the delay locked loop once can be advantageous in meeting start-up timing parameters associated with a maximum time for locking the delay locked loop.

While exemplary embodiments have been presented above, it should be appreciated that many variations exist. Furthermore, while the description uses memory devices and memory controllers as example integrated circuits that can include delay locked loops benefiting from the teachings herein, the teachings may be applied to other integrated circuits, devices, or systems having different architectures in which the same concepts can be applied. Moreover, while the embodiments above discuss launching data and data strobe signals from memory devices and memory controllers, the same concepts can be applied to launching other signals, such as, for example, address or control signals associated with data access operations.

The particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions as defined by the appended claims so that those skilled in the art should understand that they can make various changes, substitutions and alterations without departing from the spirit and scope of the inventions in their broadest form.

What is claimed is:

1. A method for operating a delay locked loop having a first end and a second end, comprising:
   providing a clock signal to the first end of the delay locked loop, wherein the clock signal is a periodic signal that includes a plurality of cycles;
   detecting that the delay locked loop has locked to the clock signal;
   after detecting that the delay locked loop has locked, omitting an omitted cycle of the plurality of cycles of the clock signal as the clock signal is provided to the delay locked loop at the first end;
   detecting the omitted cycle of the plurality of cycles at a location within the delay locked loop; and
   determining a number of cycles of the clock signal in a delay of at least a portion the delay locked loop, wherein the number of clock cycles in the delay corresponds to a number of clock cycles that transpired while the omitted cycle of the plurality of cycles propagates from the first end of the delay locked loop to the location within the delay locked loop.

2. The method of claim 1, wherein determining the number of cycles of the clock signal in the delay further comprises:
   starting a counter when the omitted cycle of the plurality of cycles is provided to the first end of the delay locked loop; and
   determining the number of cycles of the clock signal in the delay based on the counter when the omitted cycle is detected at the location within the delay locked loop.

3. The method of claim 1, wherein the location within the delay locked loop is a location other than the second end of the delay locked loop.

4. The method of claim 1, wherein omitting the omitted cycle of the plurality of cycles further comprises gating off the clock signal from the first end of the delay locked loop for a time corresponding to the omitted cycle.

5. The method of claim 1 wherein detecting the omitted cycle of the plurality of cycles further comprises comparing a signal at the location within the delay locked loop during a current cycle with the signal at the location within the delay locked loop during a previous cycle.

6. The method of claim 1, further comprising:
   after determining the number of cycles of the clock signal in the delay, outputting a signal indicating that the number of cycles has been determined; and
   while outputting the signal indicating that the number of cycles has been determined, outputting at least one additional signal representative of the number of cycles in the delay.

7. The method of claim 1, wherein omitting the omitted cycle further comprises holding an input at the first end of the delay locked loop low during a cycle of the clock signal corresponding to the omitted cycle.

8. A method of operation of a memory that includes a delay locked loop having a first end and a second end, the method comprising:
   providing a clock signal to the first end of the delay locked loop, wherein the clock signal is a periodic signal that includes a plurality of cycles;
   detecting that the delay locked loop has locked to the clock signal, wherein the delay locked loop generates an internal clock signal to provide phase alignment for data output from the memory;
   after detecting that the delay locked loop has locked to the clock signal, omitting an omitted cycle of the plurality of cycles of the clock signal as the clock signal is provided to the delay locked loop at the first end;
   detecting, at a location within the delay locked loop, the omitted cycle of the plurality of cycles;
   determining a number of cycles of the clock signal in a delay of a portion of the delay locked loop, wherein the number of clock cycles in the delay corresponds to a number of clock cycles that transpired while the omitted cycle of the plurality of cycles propagates from the first end of the delay locked loop to the location within the delay locked loop; and
   initiating a launch of data from the memory based on the internal clock signal and the number of cycles of the clock signal in the delay of the portion of the delay locked loop.

9. The method of operation of the memory of claim 8, wherein initiating the launch of data further comprises initiating the launch of data based on the internal clock signal such that data output from the memory is phase aligned with an external clock signal.

10. The method of operation of the memory of claim 9, wherein initiating the launch of data further comprises initiating the launch of data such that the data output from the memory corresponds to a selected clock cycle of the external clock signal.

11. The method of operation of the memory of claim 10, wherein the selected clock cycle is determined based on a value stored in a register on the memory.

12. The method of claim 11, wherein the selected clock cycle is determined based on a latency value stored in the register on the memory, wherein the latency value is representative of a number of clock cycles of the external clock signal to transpire between receipt of a read operation code by the memory and the output of data corresponding to the read operation code by the memory.

13. The method of claim 8, wherein the memory is a magnetic random access memory (MRAM) and wherein initiating the launch of data further comprises initiating the launch of data based on the internal clock signal such that data output from the memory is phase aligned with a falling edge of the external clock signal.

14. The method of claim 8, wherein determining the number of cycles of the clock signal in the delay further comprises:
   starting a counter when the omitted cycle of the plurality of cycles is provided to the first end of the delay locked loop; and
   determining the number of cycles of the clock signal in the delay based on the counter when the omitted cycle is detected at the location within the delay locked loop.

15. The method of claim 8, wherein omitting the omitted cycle of the plurality of cycles further comprises gating off the clock signal from the first end of the delay locked loop for a time corresponding to the omitted cycle.

16. An apparatus, comprising:
   a delay locked loop configured to receive an input at a first end and generate a feedback clock signal at a second end based on the input, wherein the delay locked loop has a delay between the first end and a location within the delay locked loop;
   an input block coupled to the delay locked loop, wherein the input block is configured to output an input clock signal to the input of the delay locked loop, wherein the input block is configured to selectively omit at least one cycle of the input clock signal in response to a skip-control signal;
   a loop monitor coupled to the delay locked loop and the input block, wherein the loop monitor is configured to:
      receive the feedback clock signal;
      assert the skip-control signal; and
      determine a number of cycles of the clock signal in the delay of the delay locked loop based on detection of the at least one omitted clock cycle at the location within the delay locked loop.

17. The apparatus of claim 16, wherein, after the loop monitor determines the number of cycles of the clock signal, the loop monitor is configured to output a signal indicating detection is complete and at least one signal representative of the number of cycles in the delay.

18. The apparatus of claim 17, further comprising:
   control circuitry coupled to the loop monitor, wherein the control circuitry is configured to initiate an output signal from the apparatus based on an internal clock signal generated by the delay locked loop and the signal representative of the number of cycles in the delay.

19. The apparatus of claim 18, wherein the apparatus is a memory that is configured to receive an external clock signal, wherein the control circuitry is configured to initiate the output signal such that the output signal is output from the memory in phase alignment with the external clock signal during a selected cycle of the external clock signal.

20. The apparatus of claim 19, wherein the memory is a magnetic random access memory (MRAM).

* * * * *